United States Patent [19]
Sittig

[11] 4,377,816
[45] Mar. 22, 1983

[54] SEMICONDUCTOR ELEMENT WITH ZONE GUARD RINGS

[75] Inventor: Roland Sittig, Umiken, Switzerland

[73] Assignee: BBC Brown, Boveri & Company Limited, Baden, Switzerland

[21] Appl. No.: 79,054

[22] Filed: Sep. 26, 1979

[30] Foreign Application Priority Data

Oct. 10, 1978 [CH] Switzerland ............... 10478/78

[51] Int. Cl.³ ............................ H01L 29/74
[52] U.S. Cl. ............................ 357/13; 357/38; 357/39; 357/55; 357/56
[58] Field of Search .................. 357/13, 20, 55, 56

[56] References Cited
U.S. PATENT DOCUMENTS

| | | | |
|---|---|---|---|
| 3,341,380 | 9/1967 | Mets et al. | 357/13 |
| 3,343,050 | 9/1967 | Eisner et al. | 357/13 |
| 3,404,295 | 10/1968 | Warner, Jr. | 357/13 |
| 3,612,959 | 10/1971 | Simon | 357/13 |
| 3,984,859 | 10/1976 | Misawa et al. | 357/55 |
| 3,994,011 | 11/1976 | Misawa et al. | 357/34 |
| 4,003,072 | 1/1977 | Matsushita | 357/34 |
| 4,125,415 | 11/1978 | Clark | 357/20 |
| 4,158,206 | 6/1979 | Neilson | 357/88 |
| 4,242,690 | 12/1980 | Temple | 357/13 |

Primary Examiner—William D. Larkins
Attorney, Agent, or Firm—Oblon, Fisher, Spivak, McClelland & Maier

[57] ABSTRACT

A semiconductor element having at least one pn junction and provided with zone guard rings for improving the suppression behavior of the pn junction, wherein the pn junction extends to the peripheral or side surface of the element and the first of a series of guard rings is coordinated with the pn junction and is bounded by the peripheral or side surface and by the lower planar surface of the element.

9 Claims, 8 Drawing Figures

4,377,816

SEMICONDUCTOR ELEMENT WITH ZONE GUARD RINGS

BACKGROUND OF THE INVENTION

1. Field of the Invention

The invention relates to semiconductor elements, particularly to avalanche diodes and reverse-biased thyristors, provided with at least one pn junction and with zone guard rings intended to improve the breakdown behavior of the pn junction.

2. Description of the Prior Art

Concerning semiconductors intended for operation with voltages over 1000 V, to improve the breakdown behavior of the pn junctions it is known that at the point where a junction reaches the peripheral surfaces of the element a well-defined surface contour is produced. This is achieved by corresponding surface chemfering angles (Cf. e.g. IEEE TRANSACTIONS ON ELECTRON DEVICES, Vol. E D 20, 1973, pp. 347–352). The production of these structures requires a great deal of technological effort and, for example in the case of negative angles, leads to considerable surface losses.

In order to avoid such surface chamfering angles it is known, e.g. from the book by Blicher "Thyristor Physics", Springer, New York 1976, pp. 231–241, that the pn junction should no longer be directed to the periphery of the element but rather a planar structure should be used with additional zone guard rings. These guard rings are located in a predictable interval corresponding to the planar junction. The pn junction and the guard rings are bounded by the same surface of the element. Through the guard rings the field distribution of the pn junction polarized in the blocking direction is divided into numerous areas whereby the maximum field intensity allowable at the surface is not exceeded in any area. On the one hand, however, such semiconductor elements have the disadvantage that through the planar structure of pn junctions there arises curvatures which on their part limit the inverse voltage breakdown of the elements. On the other hand, for inverse voltages greater than 1.5 kV, numerous guard rings are usually required so that a correspondingly large part becomes lost as an active surface for the essential function of the element.

SUMMARY OF THE INVENTION

Accordingly, it is the object of this invention to provide a novel semiconductor element having a guard ring structure in which as large an active surface as possible is available and in which the disadvantages associated with curved pn junctions are eliminated.

This and other objects are achieved according to the invention by providing a semiconductor element having at least one pn junction and provided with guard rings for improving the suppression behavior or breakdown performance of the pn junction, wherein the pn junction extends to the peripheral or side surface of the element and the first of the guard rings is coordinated with the pn junction and is bounded by the peripheral surface and by the lower planar surface of the element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
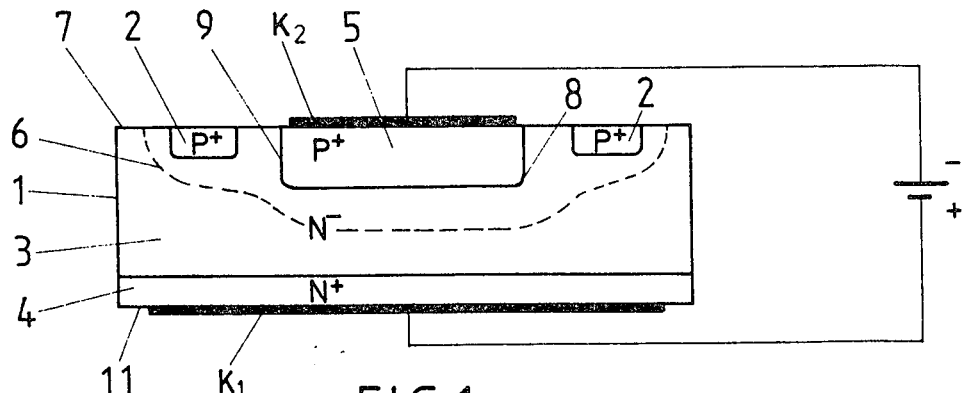
FIG. 1 is a schematic cross-sectional view of a semiconductor diode having a known guard ring structure.

Referring now to the drawings, wherein like reference numerals designate identical or corresponding parts throughout the several views, and more particularly to FIG. 1 thereof, a semi-conductor element 1, reflecting the present state of technology, is seen to include a guard ring 2, an N basis zone 3, an N+ zone bordering on the lower top surface 4, and a planar P+ zone bordering on the upper top surface 5. The metalization planned for the purpose of contact of the N+ and P+ zone are characterized by the letters $K_1$ and $K_2$. With diodes biased in the blocking direction, the guard ring 2 causes a widening of the area charge zone 6 along the surface 7 (Cf. also the work by Blicher cited above). With these familiar diodes, the curvature 8 of the planar pn-junction 9 causes a reduction in the maximum inverse voltage.

Figure 2:
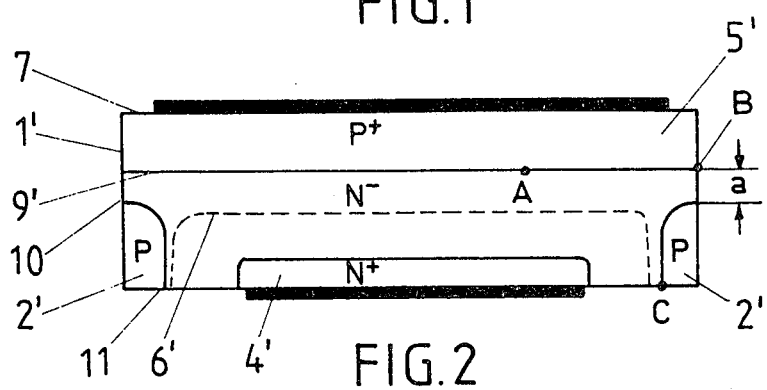
FIG. 2 is a schematic cross-sectional view of a corresponding diode having a guard ring structure according to the invention.

The diode 1' illustrated in FIG. 2 no longer indicates a curved pn junction. Rather, the pn-junction 9 extends to the peripheral surface 10. With diodes biased in the blocking direction there results an additional widening of the area charge zone 6' through the guard ring 2'. But, in accordance with the invention, this no longer borders on the top surface 7 as it does with familiar semiconductors, but rather is situated between the peripheral surface 10 and the lower top surface 11. The interval, a, between the pn junction 9' and the guard ring 2' is selected especially in such a way that the corresponding semiconductor area is discharged at the latest at half of the planned inverse voltage of charge carriers; and thereby the area charge zone 6' at this voltage reaches the guard ring 2'. With such dimensions, the maximum field intensity at point B and at point C constitutes only about 70% of the field intensity at point A. Such a reduction of the top surface field intensity is generally sufficient to provide a defined avalanche break-through within the diode upon reaching the break-through voltage.

Figure 3:
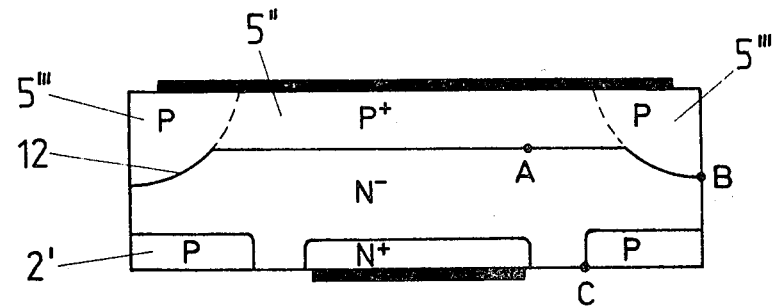
FIGS. 3 to 6 are schematic cross-sectional views of several embodiments of diode incorporating the guard ring structure of the invention.

A further reduction in the top surface field intensity can, as is shown in FIG. 3, be achieved by reducing the charge carrier concentration of the P+ zone near the periphery 10 by subsequent compensation diffusion. Then the P+ zone 5″ and the P zone 5‴ formed within the element are obtained. The additionally resulting curvature 12 causes no disturbance because it is compensated by the small charge carrier concentration of the P zone 5‴ near this curvature, the effect of which influences the breakthrough voltage. Nevertheless, it has proven advantageous to see to it that the curvature 12 is not situated exactly opposite the guard ring 2. Rather, in the projection onto the guard ring 2', the curvature 12 should be situated on the straight part of this ring.

Figure 4:
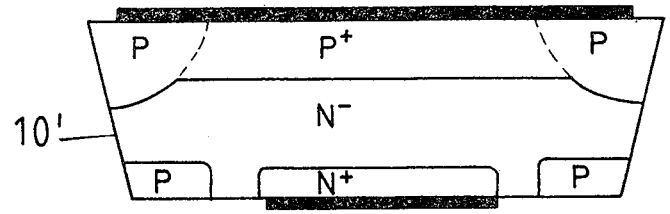
Figure 5:
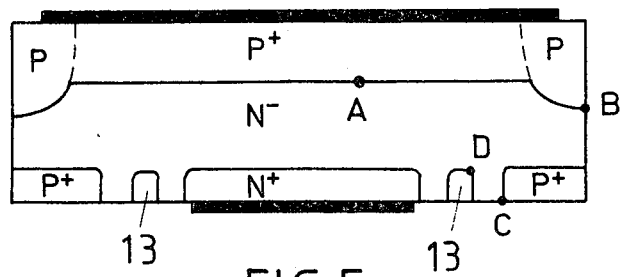
Figure 6:
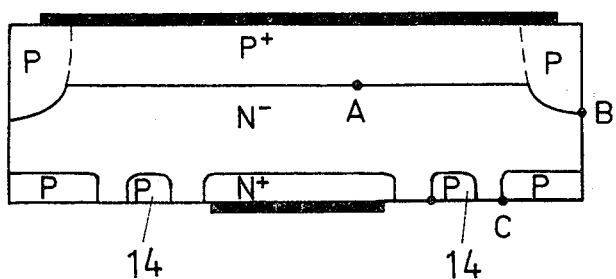

If desired, in order to obtain an even further reduction in the top surface field intensity, the peripheral surface 10', as shown in FIG. 4, can be set at an angle. The etched groove indicated as 13 in FIG. 5 or the additional guard ring pictured as 14 in FIG. 6 also improves the suppression behavior of the semiconductor diode. By using the etched groove 13 (FIG. 5) the degree of field intensity at point C is limited. A third field intensity maximum appears at point D. If such additional measures for reducing the field intensity at the top surface 11 are designed then the field intensity maximum at B, at the peripheral surface 10, is also advantageously reduced by a diminution of the distance, a. In this way it has worked out well with a few of these diodes if the interval, a, is selected in such a way that the semiconductor area situated between the pn junction and the guard ring is discharged by charge carriers by a third of the maximum inverse voltage of the pn junction.

Figure 7:
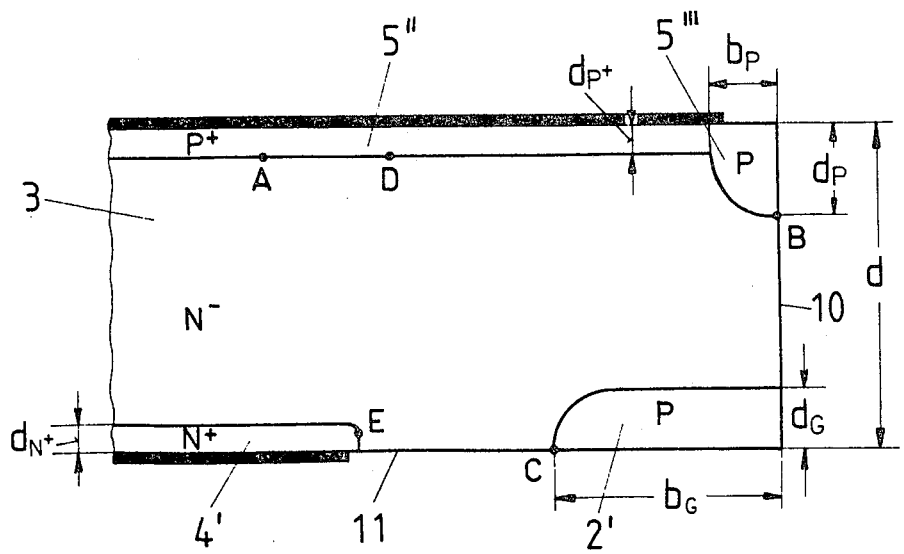
FIG. 7 is a partial cross-sectional view of an avalanche diode for 6 kV operation provided with a guard ring according to FIG. 2.

In FIG. 7 a partial section of an avalanche diode for 6 kV is reproduced, for which the following structural parameters result:

| Thickness of the entire element | d | = | 600 μm |
|---|---|---|---|
| Thickness of the P+ zone 5'' | $d_{p+}$ | = | 15 μm |
| Thickness of the P zone 5''' | $d_p$ | = | 110 μm |
| Thickness of the N+ zone 4' | $d_{n+}$ | = | 30 μm |
| Thickness of the guard ring 2' | $d_G$ | = | 110 μm |
| Width of the P zone 5''' | $b_p$ | = | 160 μm |
| Width of the guard zone 2' | $b_G$ | = | 410 μm |

The middle doping concentration of the N− basis zone 3 constitutes about $2 \times 10^{13}$ cm$^{-3}$ (N-neutron silicon was used as the starting material), whereas the top surface concentration of the P+ as well as of the N+ zone 5' and 4' constituted $5 \times 10^{20}$ cm$^{-3}$ and that of the P zone 5''' and of the guard ring 2' constituted about $10^{16}$ cm$^{-3}$. At an inverse voltage of 2.5 kV the N basis zone 3 at the top surface is discharged completely by free charge carriers. Therefore the field intensity at point A is $1.26 \times 10^5$ V/cm, and at B is $18 \times 10^5$ V/cm. At 4.9 kV the area charge zone reaches the N+ area 4'. With increasing voltage, the field intensity on the anode side in area D to B cannot increase further. On the cathode side a third field intensity maximum arises at E so that this structure is extremely favorable for P-I-N diodes. With a suppression voltage of 6 kV the field intensity at A is about $2 \times 10^5$ V/cm and at B and C about $1.2 \times 10^5$ V/cm.

For avalanche diodes this structure has the additional advantage that the break-through occurs only in the center of the element even with completely homogeneous doped starting material (neutron silicon). This structure is therefore suitable for the production of inexpensive voltage conductors.

Figure 8:
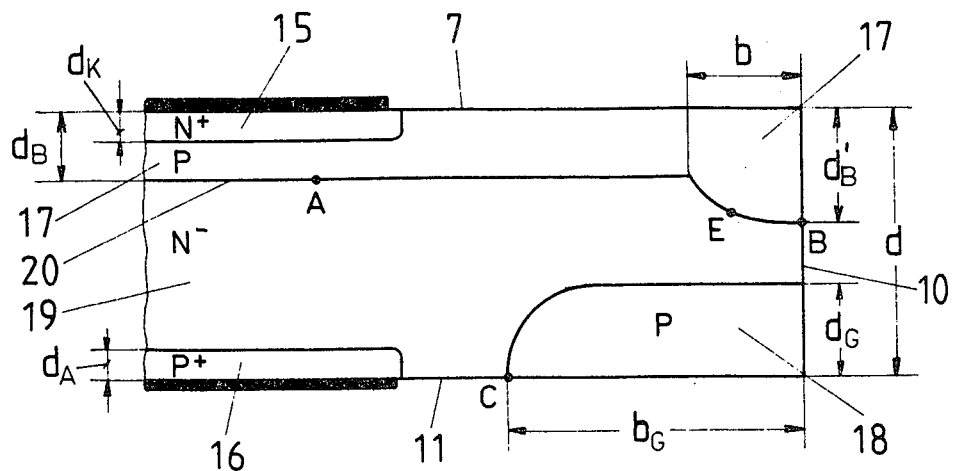
FIG. 8 is a partial cross-sectional view of a reverse direction thyristor for inverse voltage in the forward direction up to 1.8 kV also provided with a guard ring structure according to FIG. 2.

The invention described above is, of course, not limited to semiconductor diodes but can be used for a number of other semiconductor elements with pn junctions. In FIG. 8, e.g., a section from a reverse non-suppressing thyristor is reproduced for which the invention has proven itself particularly useful. This element has the following structural parameters:

| Thickness of the entire element | d | = | 350 μm |
|---|---|---|---|
| Thickness of the cathode zone 15 | $d_k$ | = | 15 μm |
| Thickness of the anode zone 16 | $d_A$ | = | 15 μm |
| Thickness of the P basis zone 17 in the area of the cathode zone | $d_B$ | = | 50 μm |
| Thickness of the P basis zone 17 in the area of the peripheral surface | $d'_B$ | = | 130 μm |
| Thickness of the guard ring 18 | $d_G$ | = | 130 μm |
| Width of the P basis zone 17' | $b_B$ | = | 230 μm |
| Width of the guard zone 18 | $b_G$ | = | 360 μm |

The middle doping concentration of the N basis zone 19 constitutes $1.05 \times 10^{14}$ cm$^{-3}$, whereas the cathode and anode zones 15 and 16 diffused into the basis zone 19 indicate a top surface concentration of about $5 \times 10^{20}$ cm$^{-3}$ each. The doping concentration of the P basis zone around the cathode zone is about $3.2 \times 10^{17}$ cm$^{-3}$ at the top surface and about $10^{16}$ cm$^{-3}$ near the periphery as well as near the guard ring 17.

The P basis zone 17 in the electrically active area is selected to be thinner than in previous thyristors which contributes to better triggering and passage characteristics. The large penetration depth $d_B'$ at the periphery causes a reduction of the field intensity at the pn-junction 20 at B as opposed to A. With a voltage of 920 volts the field intensity of A is about $1.63 \times 10^5$ V/cm, but at B only about $1.48 \times 10^5$ V/cm. At point E it is somewhat higher as a result of the curvature of the pn-junction and has about the same value as at A. But with additional increases of the suppression voltage the field intensity at B and E do not increase because the area charge zone there cannot expand further. With 1800 V the field intensity at A is $2.33 \times 10^5$ V/cm. At C a second maximum of the field intensity at the top surface has formed which achieves about the same value as that at B. Because the area charge zone has expanded further with increasing voltage, the curvature of the pn transaction can also be of no consequence here.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor element of disc shape having upper and lower surfaces and a peripheral surface, comprising:
   at least one pn junction with a higher doped conductivity zone on one side and a lower doped zone of the opposite conductivity on the other side, said pn junction extending to the peripheral surface;
   said lower doped zone having a surface forming a part of said lower surface and a part of said peripheral surface;
   at least one zone guard ring being established in said lower doped zone by a ring shaped region formed inside said lower doped zone, said ring-shaped region having a conductivity type opposite to that of said lower doped zone, and being bounded by parts of said lower and said peripheral surfaces, said surface parts of said lower and said peripheral surfaces bounding said at least one zone guard ring being without electrical contacts; and the pn junction and the at least one zone guard ring separated by an interval, a, selected small enough such that upon application of a reverse voltage to the pn junction the region of the semiconductor between the pn junction and the guard ring can be depleted of charge carriers at a voltage insufficient to cause junction breakdown.

2. A semiconductor element according to claim 1, further comprising:

said higher doped zone being of P+ conductivity type and said lower doped zone being of N− conductivity type and having a N+ conductivity type region diffused therein contiguous with said lower surface, thereby forming a P+, N−, N+ avalanche diode structure;

wherein the N+ zone is arranged planar with the lower surface and the at least one zone guard ring is formed by a P zone extending into the N− zone; and wherein the doping concentration of the P+ zone is smaller at the peripheral surface than it is in the remainder of the P+ zone.

3. A semiconductor element according to claim 1 further comprising:

said higher doped zone being of P conductivity type and having a N+ region formed therein contiguous with said upper surface, said lower doped zone being of N− conductivity type and having a P+ region formed therein contiguous with said lower surface, thereby to define a N+,P,N−,P+ thyristor structure wherein the N+ and P+ emitter zones are planar and arranged on opposite planes which define the top and bottom surfaces;

the at least one zone guard ring formed by a P zone extending into the N− base zone; and the doping concentration of the P base zone being smaller at the peripheral surface than in the remainder of the P base zone.

4. A semiconductor element according to claim 2, further comprising:

at least one additional zone guard ring formed between the at least one zone guard ring and the planar zone bordering on the lower surface, the additional guard ring bounded by the lower surface.

5. A semiconductor element according to claim 4, further comprising:

an etched groove formed between the at least one zone guard ring and the planar zone bordering on the lower surface, said groove bounded by the lower surface.

6. A semiconductor element according to claim 3, further comprising:

at least one additional guard ring formed between the at least one zone guard ring and the planar zone bordering on the lower surface, the additional guard ring bounded by the lower surface.

7. A semiconductor element according to claim 3, further comprising:

an etched groove formed between the at least one zone guard ring and the planar zone bordering on the lower surface, said groove bounded by the lower surface.

8. A semiconductor element according to claims 1, 2, 3, 4, 5, 6 or 7, further comprising:

the interval, a, selected such that the region of the semiconductor between the pn junction and the guard ring can be depleted of charge carriers if a reverse voltage applied to the pn junction has increased to a half of a maximum reverse voltage which results in junction breakdown.

9. A semiconductor element according to claim 8, further comprising:

the interval, a, selected such that the region of the semiconductor element between the pn junction and the guard ring can be depleted of charge carriers if a reverse voltage applied to the pn junction has increased to a third of said maximum reverse voltage.

* * * * *